（12) United States Patent
Dünsbier

(10) Patent No.: US 10,488,441 B2
(45) Date of Patent: Nov. 26, 2019

(54) PRINTED CIRCUIT BOARD AND MOTOR VEHICLE EQUIPPED WITH SUCH A PRINTED CIRCUIT BOARD

(71) Applicant: Audi AG, Ingolstadt (DE)

(72) Inventor: Stefan Dünsbier, Regensburg (DE)

(73) Assignee: AUDI AG, Ingolstadt (DE)

( * ) Notice: Subject to any disclaimer, the term of this patent is extended or adjusted under 35 U.S.C. 154(b) by 380 days.

(21) Appl. No.: 15/486,003

(22) Filed: Apr. 12, 2017

(65) Prior Publication Data
US 2017/0299635 A1   Oct. 19, 2017

(30) Foreign Application Priority Data
Apr. 13, 2016   (DE) .................. 10 2016 004 508

(51) Int. Cl.
| | |
|---|---|
| *G01R 15/14* | (2006.01) |
| *G01R 15/20* | (2006.01) |
| *G01R 19/00* | (2006.01) |
| *H05K 1/02* | (2006.01) |
| *H05K 1/18* | (2006.01) |

(52) U.S. Cl.
CPC ......... *G01R 15/146* (2013.01); *G01R 15/202* (2013.01); *G01R 19/0092* (2013.01); *H05K 1/0218* (2013.01); *H05K 1/0254* (2013.01); *H05K 1/185* (2013.01); *H05K 2201/0715* (2013.01); *H05K 2201/10151* (2013.01)

(58) Field of Classification Search
CPC ... G01R 1/203; G01R 15/146; G01R 19/0007
See application file for complete search history.

(56) References Cited

U.S. PATENT DOCUMENTS

| | | | | |
|---|---|---|---|---|
| 2007/0008679 | A1* | 1/2007 | Takahasi | ................. H01L 24/49 |
| | | | | 361/600 |
| 2017/0010309 | A1* | 1/2017 | Etschmaier | .......... G01R 15/202 |

FOREIGN PATENT DOCUMENTS

| | | | |
|---|---|---|---|
| CN | 202353916 | * | 7/2012 |
| CN | 102881426 A | | 1/2013 |
| CN | 105072802 A | | 11/2015 |
| DE | 102011080153 | | 1/2013 |
| DE | 102013204889 | | 9/2014 |
| EP | 0 901 166 | | 3/1999 |
| JP | H08-262063 A | | 10/1996 |

OTHER PUBLICATIONS

Chinese Search Report dated Dec. 19, 2018 with respect to counterpart Chinese patent application 201710235625X.
Translation of Chinese Search Report dated Dec. 19, 2018 with respect to counterpart Chinese patent application 201710235625X.

* cited by examiner

*Primary Examiner* — Tung X Nguyen
(74) *Attorney, Agent, or Firm* — Henry M. Feiereisen LLC

(57) ABSTRACT

A printed circuit board includes a high voltage section, a high current conductor which is arranged in the high voltage section, and a low voltage section which is separated from the high voltage section. For this purpose, the low voltage section has shielding layers which shield the low voltage section from the high voltage section. A signal processing device is embedded between the shielding layers.

18 Claims, 4 Drawing Sheets

PRINTED CIRCUIT BOARD AND MOTOR VEHICLE EQUIPPED WITH SUCH A PRINTED CIRCUIT BOARD

CROSS-REFERENCES TO RELATED APPLICATIONS

This application claims the priority of German Patent Application, Serial No. 10 2016 004 508.6, filed Apr. 13, 2016, pursuant to 35 U.S.C. 119(a)-(d), the disclosure of which is incorporated herein by reference in its entirety as if fully set forth herein.

BACKGROUND OF THE INVENTION

The present invention relates to a printed circuit board and to a motor vehicle equipped with such a printed circuit board.

The following discussion of related art is provided to assist the reader in understanding the advantages of the invention, and is not to be construed as an admission that this related art is prior art to this invention.

Printed circuit boards that can carry large voltages are called high voltage printed circuit boards (HV-PCB) and differ from printed circuit boards for low voltage application by the provision of a high current conductor which is embedded in the printed circuit board for conducting high currents with amperage of typically more than 100 amperes.

In order to precisely monitor the amperage, the presence of additional measuring devices and a downstream signal processing device are necessary. The signal processing device is arranged on separate low voltage boards for reasons of electromagnetic compatibility. As a result, the demand for installation space is substantial. This is a problem, in particular when motor vehicles are involved that have on-board high voltage electrical systems for drive devices because of the limited available space.

It would be desirable and advantageous to address these problems and to obviate other prior art shortcomings.

SUMMARY OF THE INVENTION

According to one aspect of the present invention, a printed circuit board includes a high voltage section, a high current conductor arranged in the high voltage section, a low voltage section having two shielding layers to shield the low voltage section from the high voltage section, and a signal processing device embedded between the shielding layers.

The present invention resolves prior art problems by integrating in a single-piece printed circuit board a high voltage section which includes the high current conductor, and an additional low voltage section which receives the electromagnetically highly sensitive signal processing device in an isolated manner. As a result, the need for separate spaced-apart low voltage circuit boards is eliminated. In particular in the automobile sector, a printed circuit board in accordance with the present invention can replace conductor bar arrangements, so-called busbars, that have been used heretofore and require much installation space. Advantageously, both the high current conductor and the signal processing device can now be arranged in a particularly space-saving manner, while assuring electromagnetic compatibility at the same time. A printed circuit board in accordance with the present invention can also be best suited to project-specific and/or application-specific requirements at hand and can be produced with ease and on a large scale.

The low voltage section and the high voltage section are configured in particular without overlap and/or separate over the length and width of the printed circuit board. The printed circuit board, in turn, includes an electrically insulating carrier made, for example, of epoxy.

The high current conductor is suitably made of electroconductive material such as copper and is adequate to handle currents of effective amperage of at least 100 A, advantageously of at least 150 A. The high current conductor has a cross sectional area of at least 1 $mm^2$ and/or a width of at least 2 mm and/or a thickness of at least 0.2 mm. Currently preferred is a cross sectional area of at least 2 $mm^2$ and/or a width of at least 4 mm and/or a thickness of at least 0.5 mm.

A printed circuit board according to the present invention may include at least one additional embedded high current conductor, with the high current conductors being able to be embedded in different layers of the high voltage section.

The low voltage section can be configured to have a first one of the shielding layers, the carrier, and a second one of the shielding layers arranged along a vertical direction of the printed circuit board, with the signal processing device being arranged in a recess of the carrier. Thus, the shielding layers extend in longitudinal and transverse directions of the printed circuit board above and below the signal processing device and regions of the carrier that are adjacent to the signal processing device. The shielding layers can be configured to mask surface portions of the carrier in particular. It is, of course, also conceivable to embed the shielding layers entirely or in part within the carrier. Suitably, the shielding layers are made of electroconductive material such as copper so as to effect a good electromagnetic shielding. Advantageously, the shielding layers can be coupled capacitively or galvanically with a reference potential. Of course, the printed circuit board can include an insulating varnish coating to coat at least a region of the surface of the carrier and/or the shielding layers.

According to another advantageous feature of the present invention, the signal processing device can be arranged spaced-apart from the high current conductor in a galvanically isolated manner. Thus, a smallest distance between the high current conductor and the signal processing device is selected in longitudinal and transverse directions of the printed circuit board such that an appropriate galvanic decoupling is ensured. The distance between the signal processing device and the high current conductor may amount, for example, to at least 4 mm, thereby typically realizing a galvanic isolation at a potential difference of up to 400 V.

According to another advantageous feature of the present invention, measuring conductors can be embedded at least in one region within the low voltage section and contact the signal processing device, and a measuring member can have an output for delivering a measuring signal for the signal processing device, wherein the measuring conductors are electrically-conductively connectable or connected to the measuring member for conducting a current along the high voltage conductor. The measuring conductors can extend along the same shielding layer in which also the signal processing device is embedded and can be configured to guide measuring signals with levels in the order of 1 µV to 100 mV. As a result, the measuring conductors require only a very slight conductor cross section. At least one or all measuring conductors may also extend outside of the low voltage section, i.e. extend in the direction of the high current conductor outside the region of the printed circuit board, which region is screened by the shielding layers.

According to another advantageous feature of the present invention, the high voltage conductor can be interrupted to define a breach and can include first connections to allow connection of the measuring member to thereby bridge the breach, with the measuring conductors having second connections for the output of the measuring member. Thus, the measuring member, which ascertains the amperage along the high current conductor, can be looped into the high current conductor at the first connection. The second connections can each be configured as through-connection or via (vertical interconnect access) from the measuring conductors to the surface of the carrier. The measuring member, in turn, can be secured to the printed circuit board at the first connections, e.g. through a soldering process. As an alternative or in addition, provision may be made for the measuring member to be embedded in the high voltage section, and for the output of the measuring member to be connected to the measuring conductors.

According to another advantageous feature of the present invention, the measuring member can be a shunt resistor or a Hall sensor. The configuration of the measuring member as a shunt resistor is especially suitable for embedment in the carrier.

According to another advantageous feature of the present invention, the signal processing device can be configured as an integrated circuit, e.g. as application-specific integrated circuit (ASIC). The integrated circuit is able to realize in particular an evaluation function of measuring signals generated by the measuring member and can be embedded in the printed circuit board in any manner known in the art.

According to another advantageous feature of the present invention, the high voltage section can include to shield layers shielding at least one region of the high current conductor from the environment of the printed circuit board. The high current conductor may hereby be arranged between the shielding layers of the high voltage section, so that emission of electromagnetic waves to the outside is suppressed. This improves electromagnetic compatibility of the printed circuit board as a whole against its environment so that the need for an additional conductive housing to receive and shield a printed circuit board, as known in the art, or the need for afore-mentioned current rails is eliminated.

According to another advantageous feature of the present invention, at least the high voltage section can be configured to include a bend. The printed circuit board may include a bend of at least 10°, or at least 30°. Currently preferred is a bend of 45°. Conventional printed circuit boards for low voltage applications, having such a bend, so called 3D-PCB, are known and corresponding manufacturing processes can be applied to manufacture a printed circuit board according to the present invention. The presence of the bend enables the printed circuit board to be best suited to the installation scenario at hand so that additional installation space can be saved in particular when tight installation conditions are involved.

According to another aspect of the present invention, a motor vehicle includes a printed circuit board which includes a high voltage section, a high current conductor arranged in the high voltage section, a low voltage section having shielding layers to shield the low voltage section from the high voltage section, and a signal processing device embedded between the shielding layers, a high voltage component which is electrically-conductively connected to the high current conductor of the printed circuit board, and a control device which is connected to an output of the signal processing device.

According to another advantageous feature of the present invention, the high voltage component can be a high voltage battery or a high voltage battery module. For example, the printed circuit board can be installed in a battery junction box. The high voltage battery or the high voltage battery module is provided in particular to provide electric energy for a drive device of a motor vehicle.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
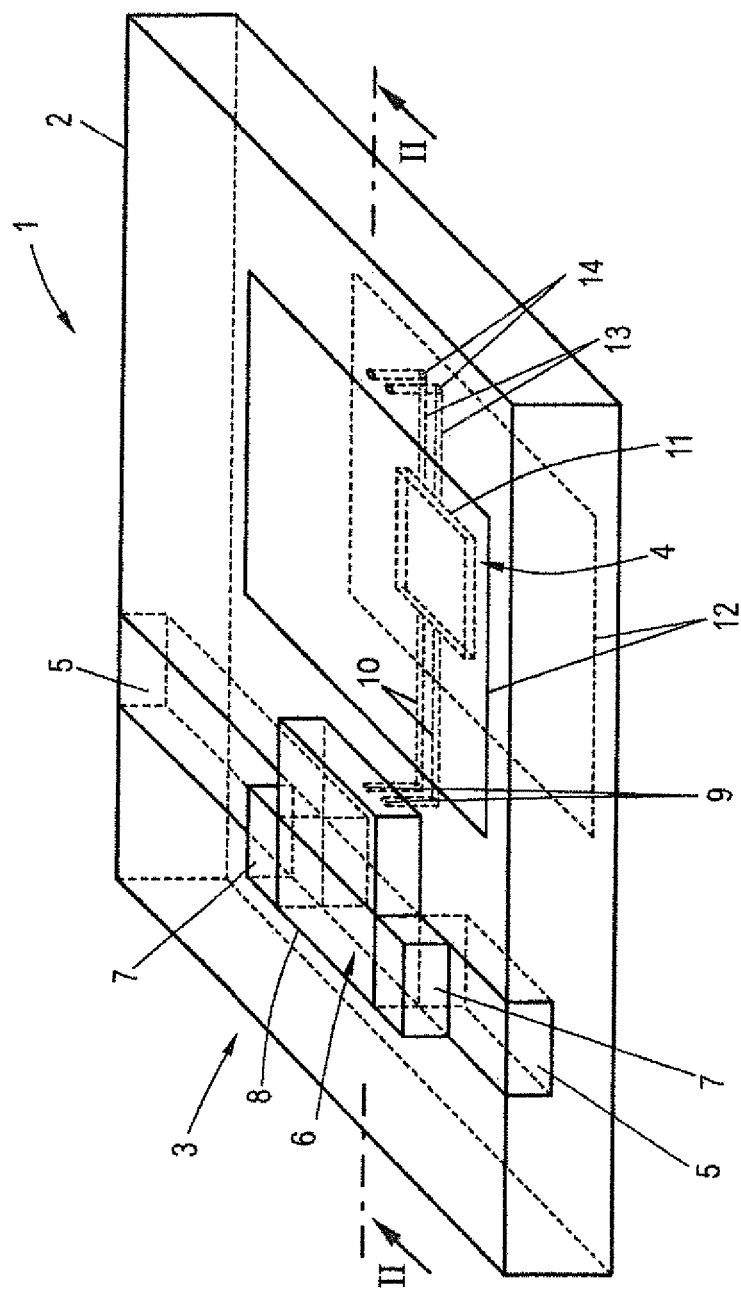
FIG. 1 is a schematic perspective view of a first embodiment of a printed circuit board according to the present invention.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments may be illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a schematic perspective view of a first embodiment of a printed circuit board according to the present invention, generally designated by reference numeral 1. The printed circuit board 1 includes a carrier 2 of electrically insulating material, a high voltage section 3, and a low voltage section 4 in the absence of any overlap between the high voltage section 3 and the low voltage section 4.

Extending within the high voltage section 3 is a high current conductor 5 which is made of copper and configured to carry an effective amperage of up to 400 A. The high current conductor 5 is shown here purely schematically and may have various branches and external connection options. Although not shown, it is also conceivable to provide several high current conductors 5 in various layers of the printed circuit board 1.

The high current conductor is embedded at three sides in the carrier 2 and thus is exposed on one side at the surface of the carrier 2. The high current conductor 5 is breached in a region 6, with first connections 7 being provided to which a measuring member 8, e.g. a shunt resistor, is soldered. The measuring member 8 may also be configured as a Hall sensor. The measuring member 8 includes a not shown output for tapping a measuring signal. The output is connected with second connections 9 in the form of through-connections to corresponding measuring conductors 10.

The measuring conductors 10 extend from the second connections 9 to the low voltage section 4 where a signal processing device 11, configured as an application-specific integrated circuit (ASIC), is embedded within the carrier 2 and in contact with the measuring conductors 10. The signal processing device 11 implements an evaluation function for the measuring signals which represent the amperage along the high current conductor 5 and have a level in the order of 1 µV to 100 mV. In order to reduce electromagnetic irradiation of the substantially higher currents along the high current conductor 5, the low voltage section 4 is provided on the surfaces of the carrier 2 with shielding layers 12 of copper, respectively arranged above and below the signal processing device 11. In addition, the signal processing device 11 is distanced galvanically isolated from the high current conductor 5. A distance of 4 cm is hereby maintained at a potential difference of 400 V.

The signal processing device 11 is in contact with two output conductors 13 which are routed in the form of through-connections to third connections 14, from which evaluated signals of the signal processing device 11 can be tapped from outside.

Figure 2:
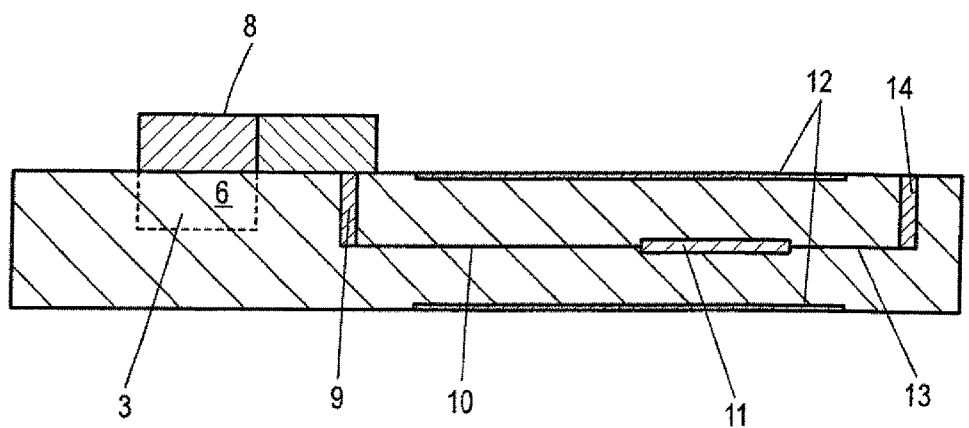
FIG. 2 is a sectional view of the printed circuit board, taken along the line II-II in FIG. 1.

FIG. 2 shows a sectional view of the printed circuit board 1, taken along the line II-II in FIG. 1. As is readily apparent, the signal processing device 11 is shielded on both sides by the shielding layers 12 against irradiation of the high current conductors 5 and extends with the measuring conductors 10 and the output conductors 13 in a layer of the printed circuit board 1.

Figure 3:
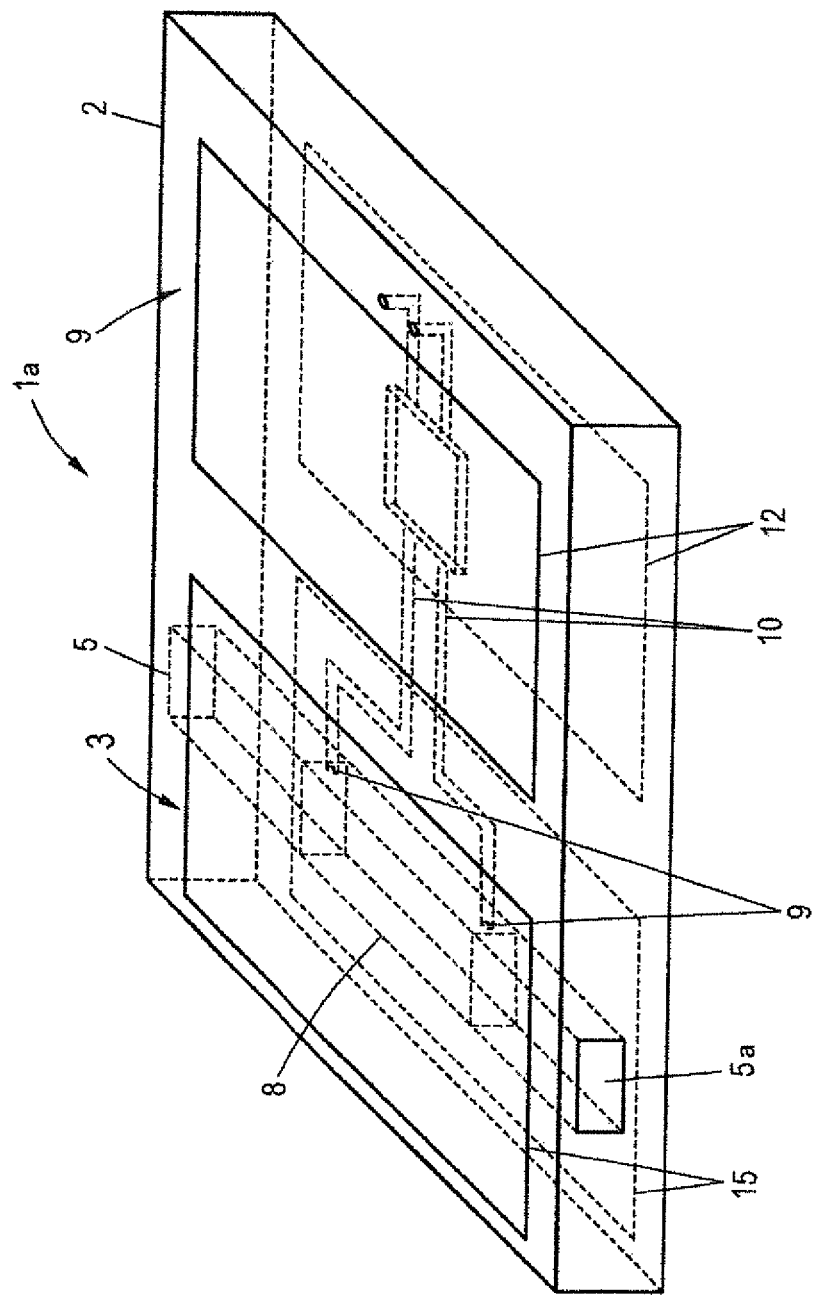
FIG. 3 is a schematic perspective view of a second embodiment of a printed circuit board according to the present invention.

Referring now to FIG. 3, there is shown a schematic perspective view of a second embodiment of a printed circuit board according to the present invention, generally designated by reference numeral 1a. In the following description, parts corresponding with those in FIG. 1 will be identified, where appropriate for the understanding of the invention, by corresponding reference numerals followed by an "a". The description below will center on the differences between the embodiments. In this embodiment, provision is made for a high current conductor 5a which is embedded in its entirety in the carrier 2 and thus encased on all four sides by the carrier 2. Also the measuring member 8 is fully embedded in the carrier 2, with its outputs or connections 9 being in direct contact with the measuring conductors 10 in a layer. In addition to the low voltage section 4, also the high voltage section 3 includes shielding layers 15, respectively arranged above and below the high current conductor 5a at the surface of the carrier 2. As a result, the environment of the printed circuit board 1a is shielded from the high current conductor 5a, so that the need for accommodation of the printed circuit board 1a in an electrically conductive housing in the installed state can be eliminated.

Figure 4:
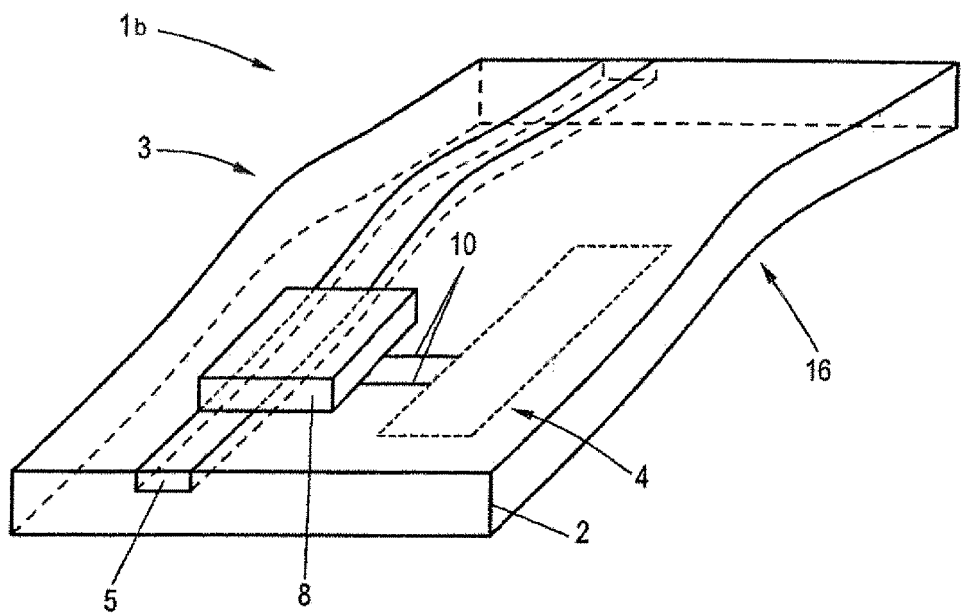
FIG. 4 is a schematic perspective view of a third embodiment of a printed circuit board according to the present invention.

FIG. 4 shows a schematic perspective view of a third embodiment of a printed circuit board according to the present invention, generally designated by reference numeral 1b. In the following description, parts corresponding with those in FIG. 1 will be identified, where appropriate for the understanding of the invention, by corresponding reference numerals followed by an "b", The description below will center on the differences between the embodiments. In this embodiment, the printed circuit board 1b has in the high voltage section 3 a bend 16 which is also formed in the carrier 2 and the high current conductor 5. The presence of the bend 16 enables the printed circuit board 1b to be guided around other objects, when tight installation situations are involved. The low voltage section 4 and the measuring member 8 are shown in FIG. 4 only schematically, and provision may be made here for the surface-side embedment of the high current conductor 5 and a measuring member 8 that is arranged on the surface, as shown in FIGS. 1 and 2, or for a complete embedment of the high current conductor 5 and the measuring member 8, as shown in FIG. 3.

Figure 5:
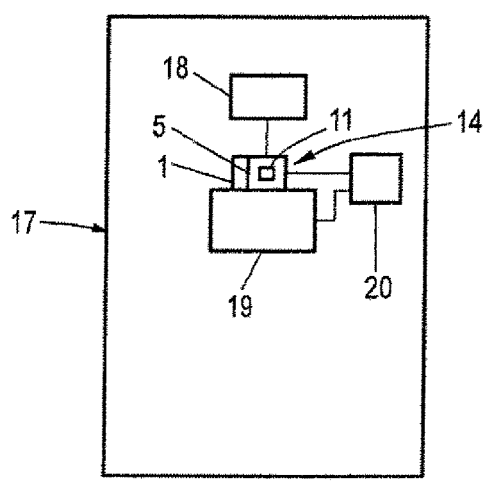
FIG. 5 is a principal illustration of a motor vehicle according to the present invention.

FIG. 5 shows a principal illustration of a motor vehicle according to the present invention, generally designated by reference numeral 17. The motor vehicle 17 includes a drive device 18 which is supplied with electric energy from a high voltage component 19 configured as high voltage battery. The high voltage component 19 is electroconductively connected with a high current conductor 5, 5a of a printed circuit board 1, 1a, 1b. For sake of simplicity, reference numerals 1 and 5 have been used in FIG. 5 to designate the printed circuit board and the high current conductor in general. The motor vehicle 17 further includes a control device 20 in the form of a battery control unit, which is connected via the third connections 14 of the printed circuit board 1, 1a, 1b with its signal processing device 11.

Although not shown in detail, the printed circuit board 1, 1a, 1b of the motor vehicle 17 may include a plurality of high voltage components 19 which are configured as high voltage battery modules. The high voltage components 19 may be a converter or a charger.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. A printed circuit board, comprising:
   a high voltage section;
   a high current conductor arranged in the high voltage section;
   a low voltage section having two shielding layers to shield the low voltage section from the high voltage section;
   a signal processing device embedded between the shielding layers; and
   measuring conductors embedded at least in one region within the low voltage section and contacting the signal processing device, and a measuring member having an output for delivering a measuring signal for the signal processing device, said measuring conductors being electrically-conductively connectable to the measuring member for conducting a current along the high voltage conductor.

2. The printed circuit board of claim 1, wherein the signal processing device is arranged spaced-apart from the high current conductor in a galvanically isolated manner.

3. The printed circuit board of claim 1, wherein the high voltage conductor is interrupted to define a breach and includes first connections to allow connection of the measuring member to thereby bridge the breach, said measuring conductors having second connections for the output of the measuring member.

4. The printed circuit board of claim 1, wherein the measuring member is embedded in the high voltage section, said output of the measuring member being connected to the measuring conductors.

5. The printed circuit board of claim 1, wherein the measuring member is a shunt resistor.

6. The printed circuit board of claim 1, wherein the measuring member is a Hall sensor.

7. The printed circuit board of claim 1, wherein the signal processing device is configured as an integrated circuit.

8. The printed circuit board of claim 1, wherein the high voltage section includes shielding layers to shield at least one region of the high current conductor from the environment of the printed circuit board.

9. The printed circuit board of claim 1, wherein at least the high voltage section is configured to include a bend.

10. A motor vehicle, comprising
a printed circuit board comprising a high voltage section, a high current conductor arranged in the high voltage section, a low voltage section having two shielding layers to shield the low voltage section from the high voltage section, and a signal processing device embedded between the shielding layers;
a high voltage component electrically-conductively connected to the high current conductor; and
a control device connected to an output of the signal processing device,
wherein the printed circuit board includes measuring conductors embedded at least in one region within the low voltage section and contacting the signal processing device, and a measuring member having an output for delivering a measuring signal for the signal processing device, said measuring conductors being electrically-conductively connectable to the measuring member for conducting a current along the high voltage conductor.

11. The motor vehicle of claim 10, wherein the high voltage component is a high voltage battery or a high voltage battery module.

12. The motor vehicle of claim 10, wherein the signal processing device is arranged spaced-apart from the high current conductor in a galvanically isolated manner.

13. The motor vehicle of claim 10, wherein the high voltage conductor is interrupted to define a breach and includes first connections to allow connection of the measuring member to thereby bridge the breach, said measuring conductors having second connections for the output of the measuring member.

14. The motor vehicle of claim 10, wherein the measuring member is embedded in the high voltage section, said output of the measuring member being connected to the measuring conductors.

15. The motor vehicle of claim 10, wherein the measuring member is a shunt resistor or a Hall sensor.

16. The motor vehicle of claim 10, wherein the signal processing device is configured as an integrated circuit.

17. The motor vehicle of claim 10, wherein the high voltage section includes shielding layers to shield at least one region of the high current conductor from the environment of the motor vehicle.

18. The motor vehicle of claim 10, wherein at least the high voltage section is configured to include a bend.

* * * * *